(12) United States Patent
Yen

(10) Patent No.: US 8,806,091 B2
(45) Date of Patent: Aug. 12, 2014

(54) SIGNAL GENERATING APPARATUS AND SIGNAL GENERATING METHOD

(75) Inventor: Chin-Hsien Yen, Keelung (TW)

(73) Assignees: Silicon Motion Inc., Chuangyeyuan, Tainan Digital, Futian, Shenzhen, Guangdong Province (CN); Silicon Motion Inc., Jhubei, Hsinchu County (TW)

( * ) Notice: Subject to any disclaimer, the term of this patent is extended or adjusted under 35 U.S.C. 154(b) by 17 days.

(21) Appl. No.: 12/611,119

(22) Filed: Nov. 3, 2009

(65) Prior Publication Data

US 2010/0299462 A1 Nov. 25, 2010

(30) Foreign Application Priority Data

May 19, 2009 (TW) .................................. 098116544

(51) Int. Cl.
*G06F 3/00* (2006.01)
*G06F 13/42* (2006.01)

(52) U.S. Cl.
CPC .................................... *G06F 13/423* (2013.01)
USPC .......................................................... 710/61

(58) Field of Classification Search
None
See application file for complete search history.

(56) References Cited

U.S. PATENT DOCUMENTS

| 5,311,447 | A | 5/1994 | Bonne | |
|---|---|---|---|---|
| 6,563,722 | B1 | 5/2003 | John | |
| 7,436,265 | B2 * | 10/2008 | Park et al. | 331/18 |
| 8,285,897 | B2 * | 10/2012 | Weigold et al. | 710/61 |
| 2002/0087292 | A1 | 7/2002 | Lee | |
| 2002/0124200 | A1 * | 9/2002 | Govindaraman | 713/400 |
| 2007/0159221 | A1 * | 7/2007 | Ma et al. | 327/141 |
| 2008/0037050 | A1 * | 2/2008 | Sasaki | 358/1.13 |
| 2008/0320202 | A1 * | 12/2008 | Monks et al. | 710/313 |
| 2009/0132730 | A1 * | 5/2009 | Kim et al. | 710/16 |

* cited by examiner

*Primary Examiner* — Henry Tsai
*Assistant Examiner* — Aurangzeb Hassan
(74) *Attorney, Agent, or Firm* — Winston Hsu; Scott Margo

(57) ABSTRACT

A signal generating apparatus, applicable in a universal serial bus (USB) device, includes: a first determining circuit for receiving a data signal to determine if the data signal is generated by the universal serial bus device, and generating a first determined result; a second determining circuit coupled to the first determining circuit for receiving the data signal and the first determined result to determine a transmitting mode corresponding to the data signal according to the first determined result, and generating a second determined result; and a frequency generating circuit coupled to the second determining circuit for generating a first clock signal utilized for synchronizing the data signal according to the second determined result.

17 Claims, 6 Drawing Sheets

SIGNAL GENERATING APPARATUS AND SIGNAL GENERATING METHOD

BACKGROUND OF THE INVENTION

1. Field of the Invention

The present invention relates to a signal generating apparatus and related method, and more particularly to an apparatus that generates a reference clock signal to a controller of a universal serial bus device for synchronizing a data signal received by the universal serial bus device, and a method thereof.

2. Description of the Prior Art

In a universal serial bus (USB) system, a controller in a universal serial bus device utilizes a reference clock signal with an oscillating frequency of 12 MHz to synchronize a data signal received from a host terminal, and the reference clock signal is also utilized for synthesizing a clock signal having an oscillating frequency corresponding to the clock frequency of the data signal. For example, when the data signal received by the universal serial bus device corresponds to a high speed (HS) signal, the oscillating frequency of the clock signal is required to be 480 MHz since the data transmitting rate of the high speed data signal is 480 Mb/s. Similarly, when the data signal received by the universal serial bus device corresponds to a full speed (FS) signal, the oscillating frequency of the clock signal is required to be 12 MHz, and when the data signal received by the universal serial bus device corresponds to a low speed (LS) signal, the oscillating frequency of the clock signal is required to be 1.5 MHz. Therefore, providing an accurate 12 MHz reference clock signal, such as one that has an accuracy of +/−500 ppm, for the controller is a critical issue in the universal serial bus system field.

One conventional method is to utilize a crystal oscillator to generate the 12 MHz reference clock signal for the controller, in which the crystal oscillator is externally coupled to the controller of the universal serial bus. However, since the cost of the crystal oscillator is relatively high and the crystal oscillator is hard to embed into the universal serial bus device, another conventional way is to utilize an inductor-capacitor (LC) oscillator to generate the 12 MHz reference clock signal rather the crystal oscillator. Compared to the method utilizing the crystal oscillator, the LC oscillator is easier to embed into the universal serial bus device. However, since the oscillating frequency of the reference clock signal is hard to control when the inductor and capacitor are embedded in the integrated circuit, providing a low cost and relatively simple method of generating an accurate 12 MHz reference clock signal is a significant concern in the field of universal serial bus systems.

SUMMARY OF THE INVENTION

One objective of the present invention is therefore to provide an apparatus that generates a reference clock signal to a controller of a universal serial bus device for synchronizing a data signal received by the universal serial bus device, and a method thereof.

According to an embodiment of the present invention, a signal generating apparatus is disclosed. The signal generating apparatus is applicable in a universal serial bus (USB) device. The signal generating apparatus comprises a first determining circuit, a second determining circuit, and a frequency generating circuit. The first determining circuit receives a data signal to determine if the data signal is generated by the universal serial bus device, and generates a first determined result. The second determining circuit is coupled to the first determining circuit for receiving the data signal and the first determined result to determine a transmitting mode corresponding to the data signal according to the first determined result, and generating a second determined result. The frequency generating circuit is coupled to the second determining circuit for generating a first clock signal utilized for synchronizing the data signal according to the second determined result.

According to a second embodiment of the present invention, a signal generating method is disclosed. The signal generating method is applicable in a universal serial bus (USB) device. The signal generating method comprises the following steps: receiving a data signal to determine if the data signal is generated by the universal serial bus device, and generating a first determined result; receiving the data signal and the first determined result to determine a transmitting mode corresponding to the data signal according to the first determined result, and generating a second determined result; and generating a first clock signal utilized for synchronizing the data signal according to the second determined result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
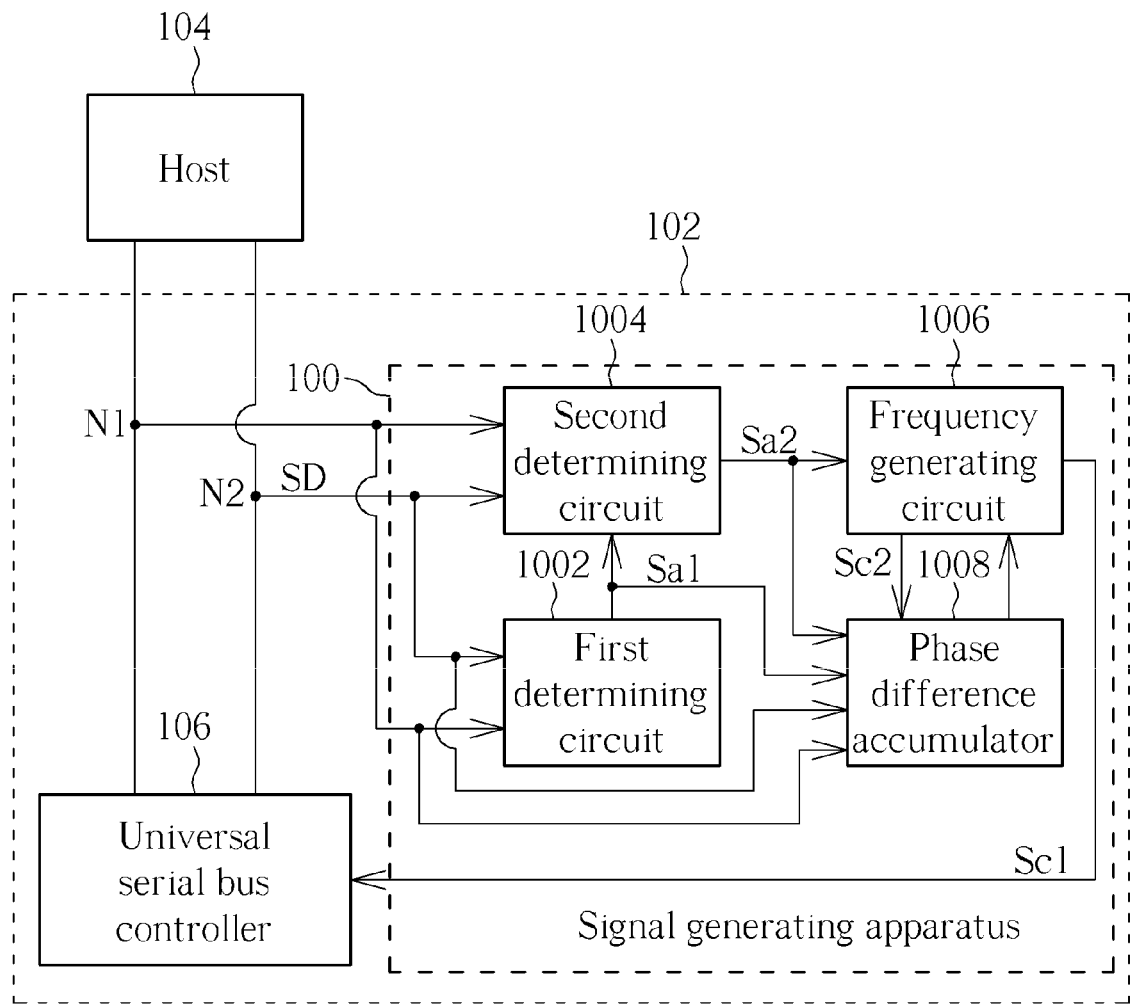
FIG. 1 is a diagram illustrating a signal generating apparatus according to an embodiment of the present invention.

Please refer to FIG. 1. FIG. 1 is a diagram illustrating a signal generating apparatus 100 according to an embodiment of the present invention. The signal generating apparatus 100 is applicable in a universal serial bus device of a universal serial bus system. Please note that, in order to clearly illustrate the signal generating apparatus 100 of the present invention, a host 104 and a universal serial bus controller 106 are further included in FIG. 1. The signal generating apparatus 100 comprises a first determining circuit 1002, a second determining circuit 1004, a frequency generating circuit 1006, and a phase difference accumulator 1008. The first determining circuit 1002 is utilized for receiving a data signal SD to determine if the data signal SD is generated by the universal serial bus device 102, and generating a first determined result Sa1. The second determining circuit 1004 is coupled to the first determining circuit 1002 for receiving the data signal SD and the first determined result Sa1 to determine a transmitting mode corresponding to the data signal SD according to the first determined result Sa1, and generating a second determined result Sa1. The frequency generating circuit 1006 is coupled to the second determining circuit 1004 for generating a first clock signal Sc1 utilized for synchronizing the data signal SD according to the second determined result Sa2. Furthermore, the frequency generating circuit 1006 generates a second clock signal Sc2 corresponding to the transmitting mode according to the second determined result Sa2, and generates the first clock signal Sc1 according to the second clock signal Sc2. The phase difference accumulator 1008 is coupled to the first determining circuit 1002, the second determining circuit 1004, and the frequency generating circuit 1006, for accumulating the phase difference between the data signal SD and the second clock signal Sc2 to generate an accumulated result, wherein the frequency generating circuit 1006 further adjusts the second clock signal Sc2 according to the accumulated result.

Figure 2:
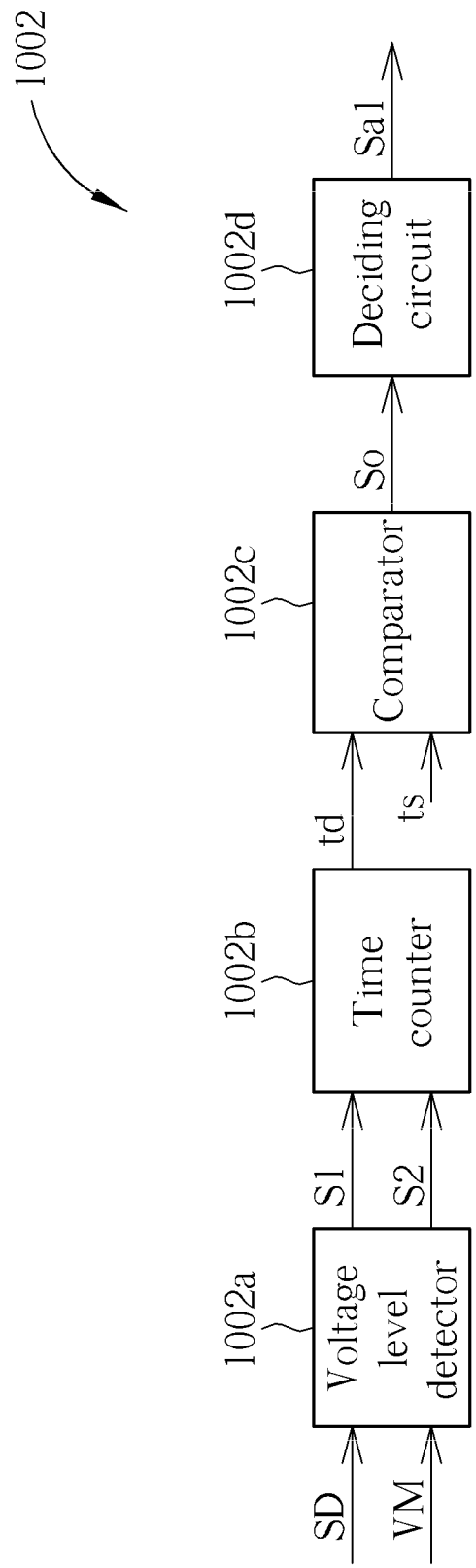
FIG. 2 is a diagram illustrating a first determining circuit in the signal generating apparatus according to an embodiment of the present invention.

The first determining circuit 1002 comprises a voltage level detector 1002a, a time counter 1002b, a comparator 1002c, and a deciding circuit 1002d as shown in FIG. 2. FIG. 2 is a diagram illustrating the first determining circuit 1002 in the signal generating apparatus 100 according to an embodiment of the present invention. The time counter 1002b is coupled to the voltage level detector 1002a for counting a time interval td between a starting signal S1 and a finishing signal S2. The comparator 1002c is coupled to the time counter 1002b for comparing the time interval td and a specific time value ts to generate a comparison result So. The deciding circuit 1002d is coupled to the comparator 1002c for determining if the data signal SD is generated by the universal serial bus device 102 according to the comparison result So.

Figure 3:
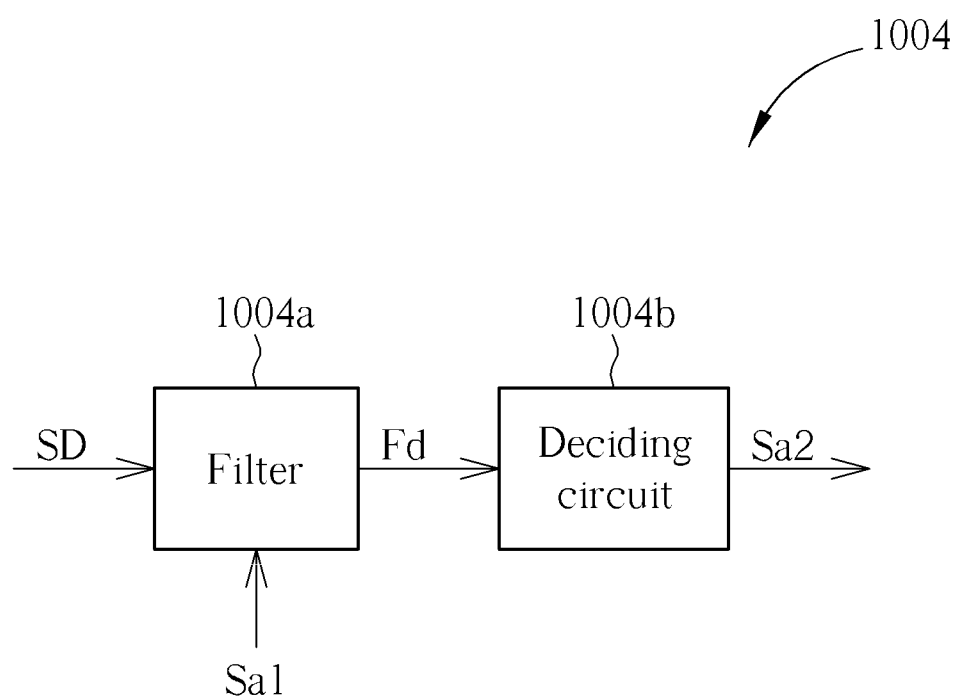
FIG. 3 is a diagram illustrating a second determining circuit in the signal generating apparatus according to an embodiment of the present invention.

The second determining circuit 1004 comprises a filter 1004a and a deciding circuit 1004b as shown in FIG. 3. FIG. 3 is a diagram illustrating the second determining circuit 1004 in the signal generating apparatus 100 according to an embodiment of the present invention. The filter 1004a is utilized for performing a filtering process upon the data signal SD to extract a transmitting rate Fd of the data signal SD. The deciding circuit 1004b is coupled to the filter 1004a for determining the transmitting mode of the data signal SD according to the transmitting rate Fd.

Figure 4:
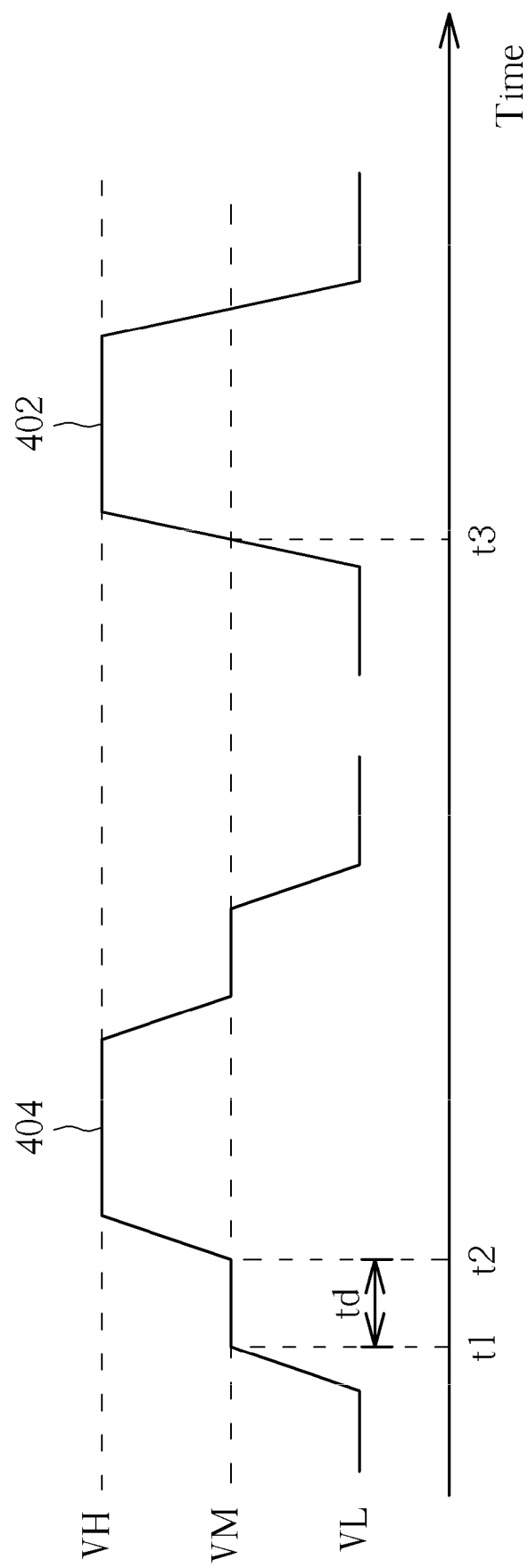
FIG. 4 is a timing diagram illustrating a data signal appearing at the terminals of the signal generating apparatus.

When the universal serial bus device 102 is plugged in the host 104 via terminals N1, N2, the first determining circuit 1002 detects the signal (i.e., the data signal SD) at the terminals N1, N2 to determine if the signal appearing at the terminals N1, N2 is generated by the host 104 or by the universal serial bus device 102. Please note that, in a universal serial bus system, the signal transmitted between the universal serial bus device 102 and the host 104 is a differential signal (i.e., DM and DP). However, in this embodiment, the differential signal transmitted between the universal serial bus device 102 and the host 104 is illustrated by the data signal SD for the sake of brevity. In the first determining circuit 1002, the voltage level detector 1002a detects a specific voltage level VM of the data signal SD as shown in FIG. 4. FIG. 4 is a timing diagram illustrating the data signal SD appearing at the terminals N1, N2 of the signal generating apparatus 100. The curve 402 represents the voltage level variation at the terminal N1, N2 when the data signal SD is transmitted from the host 104 to the signal generating apparatus 100, and the curve 404 represents the voltage level variation at the terminal N1, N2 when the data signal SD is transmitted from the signal generating apparatus 100 to the host 104, wherein the voltage level VL represents the low voltage level, the voltage level VH represents the high voltage level, and the voltage level VM represents a specific voltage level or a voltage level in a specific voltage level range between the VL and VH. For example, the voltage level VM is the average voltage level between VL and VH, but this is not the limitation of the present invention. In other words, any voltage levels between the VL and VH also belongs to the scope of the present invention. Please refer to FIG. 2 in conjunction with FIG. 4. In order to identify if the data signal SD at the terminals N1 and N2 refers to the curve 402 or to the curve 404, the voltage level detector 1002a generates the starting signal S1 when the voltage level detector 1002a detects that the data signal SD reaches the specific voltage level VM at time t1. Meanwhile, the starting signal S1 is transmitted to the time counter 1002b, and the time counter 1002b starts counting. When the voltage level detector 1002a detects that the data signal SD deviates from the specific voltage level VM at time t2, the voltage level detector 1002a generates the finishing signal S2 to the time counter 1002b, and the time counter 1002b stops counting. Meanwhile, the comparator 1002c compares the time interval td between the time t1 and the time t2 and the specific time value ts to generate a comparison result So. The deciding circuit 1002d is coupled to the comparator 1002c for determining if the data signal SD is generated by the universal serial bus device 102 according to the comparison result So, wherein when the comparison result So indicates that the time interval td is shorter than the specific time value ts, then the deciding circuit 1002d determines that the data signal SD is not generated by the universal serial bus device 102, and outputs the first determined result Sa1 to the second determining circuit 1004, and when the comparison result So indicates that the time interval td is not shorter than the specific time value ts, then the deciding circuit 1002d determines that the data signal SD is generated by the universal serial bus device 102, and outputs the first determined result Sa1 to the second determining circuit 1004. For the example of the curve 404, the deciding circuit 1002d determines that the data signal SD is generated by the universal serial bus device 102 since the specific voltage level VM remains unchanged for a period of time.

When the data signal SD appearing at the terminals N1, N2 of the signal generating apparatus 100 refers to the curve 402, the voltage level detector 1002a generates the starting signal S1 when the voltage level detector 1002a detects that the data signal SD reaches the specific voltage level VM, however the voltage level detector 1002a generates the finishing signal S2 right after the generation of the starting signal S1 since the data signal SD immediately deviates from the specific voltage level VM. Therefore, the time interval td counted by the time counter 1002b is almost 0 second. Accordingly, the comparator 1002c outputs the comparison result So indicating the time interval td is shorter than the specific time value ts, and the deciding circuit 1002d determines that the data signal SD is not generated by the universal serial bus device 102 but generated by the host 104.

When the deciding circuit 1002d determines that the data signal SD is generated by the universal serial bus device 102, the deciding circuit 1002d does not activate the second determining circuit 1004 and the phase difference accumulator

1008 according to the first determined result Sa1. When the deciding circuit 1002*d* determines that the data signal SD is generated by the host 104, the deciding circuit 1002*d* activates the second determining circuit 1004 and the phase difference accumulator 1008 according to the first determined result Sa1. Please refer to FIG. 3. The filter 1004*a* in the second determining circuit 1004 performs the filtering process upon the data signal SD to extract the transmitting rate Fd of the data signal SD, and the deciding circuit 1004*b* determines the transmitting mode of the data signal SD according to the transmitting rate Fd. In this embodiment, the filter 1004*a* filters out the signal with a center frequency other than 480 MHz, 12 MHz, or 1.5 MHz. When the transmitting rate of the data signal SD is 480 Mb/s, i.e., the data signal SD is able to pass through the filter 1004*a*, then the deciding circuit 1004*b* determines that the data signal SD corresponds to a high speed (HS) signal. When the transmitting rate of the data signal SD is 12 Mb/s, i.e., the data signal SD is able to pass through the filter 1004*a*, then the deciding circuit 1004*b* determines that the data signal SD corresponds to a full speed (FS) signal. When the transmitting rate of the data signal SD is 1.5 Mb/s, i.e., the data signal SD is able to pass through the filter 1004*a*, then the deciding circuit 1004*b* determines that the data signal SD corresponds to a low speed (LS) signal, and outputs the second determined result Sa2 to the frequency generating circuit 1006 and the phase difference accumulator 1008.

Figure 5:
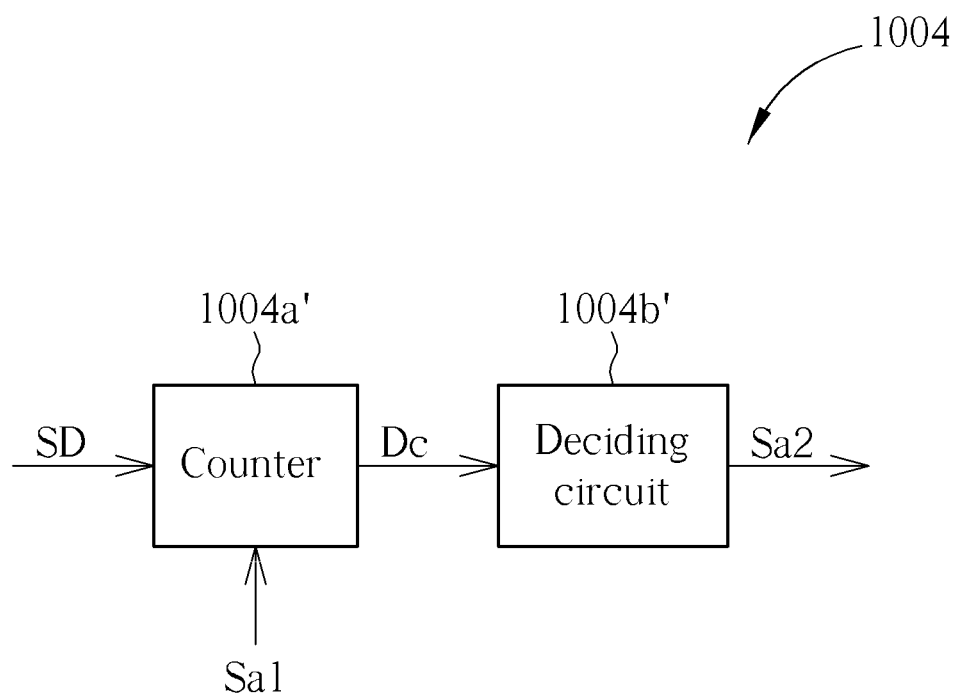
FIG. 5 is a diagram illustrating the second determining circuit in the signal generating apparatus according to another embodiment of the present invention.

Please note that the present invention is not limited to the above embodiment of the second determining circuit 1004. In another embodiment, the second determining circuit 1004 comprises a counter 1004*a'* and a deciding circuit 1004*b'*, wherein the counter 1004*a'* is coupled to the deciding circuit 1004*b'* as shown in FIG. 5. FIG. 5 is a diagram illustrating the second determining circuit 1004 in the signal generating apparatus 100 according to another embodiment of the present invention. The counter 1004*a'* counts a data transmitting amount Dc of the data signal SD in a specific time, and the deciding circuit 1004*b'* determines the transmitting mode of the data signal SD according to the data transmitting amount Dc. In this embodiment, the counter 1004*a'* counts the edge of each data bit of the data signal SD in the specific data to determine the data transmitting amount Dc of the data signal SD. Then, the deciding circuit 1004*b'* determines if the data signal SD corresponds to the high speed data signal, the full speed data signal, or the low speed data signal according to the data transmitting amount Dc, and outputs the second determined result Sa2 to the frequency generating circuit 1006 and the phase difference accumulator 1008.

After the frequency generating circuit 1006 receives the second determined result Sa2, the frequency generating circuit 1006 outputs the second clock signal Sc2 corresponding to the transmitting mode according to the second determined result Sa2. Therefore, when the data signal SD corresponds to the high speed data signal, the frequency generating circuit 1006 generates the second clock signal Sc2 with an oscillating frequency of 480 MHz. When the data signal SD corresponds to the full speed data signal, the frequency generating circuit 1006 generates the second clock signal Sc2 with an oscillating frequency of 12 MHz. When the data signal SD corresponds to the low speed data signal, the frequency generating circuit 1006 generates the second clock signal Sc2 with an oscillating frequency of 1.5 MHz. At the same time, the frequency generating circuit 1006 also generates the first clock signal Sc1 with an oscillating frequency of 12 MHz, and the first clock signal Sc1 is provided to the universal serial bus controller 106 to synchronize the received data signal SD. Please note that, in this embodiment, the frequency generating circuit 1006 utilizes an RC (resistor-capacitor) oscillator to generate an oscillating signal with a fixed frequency (e.g., 480 MHz). Then, the RC oscillator utilizes an adjustable frequency divider to frequency-divide the oscillating signal to generate the second clock signal Sc2 with an oscillating frequency of 480 MHz, 12 MHz, or 1.5 MHz. Furthermore, the RC oscillator utilizes another frequency divider to frequency-divide the oscillating signal to generate the first clock signal Sc1 with an oscillating frequency of 12 MHz. The RC oscillator may be implemented by an integrated circuit.

To generate an accurate (e.g., +/−500 ppm) first clock signal Sc1 for synchronizing the data signal SD, the phase difference accumulator 1008 generates an accumulated result after accumulating the phase difference between the data signal SD and the second clock signal Sc2 for a predetermined time (e.g., a specific number of clock cycles of the oscillating signal), wherein the accumulated result is the accumulated phase difference in the specific number of clock cycles of the oscillating signal. Then, the frequency generating circuit 1006 further adjusts the phase or the frequency of the oscillating signal according to the accumulated result to generate the first clock signal Sc1 and the second clock signal Sc2 accurately. Please note that the present invention is not limited to the signal type of the data signal SD. In other words, any signal received from the host 104 and having a predetermined data length may be utilized for adjusting the oscillating signal generated by the RC oscillator. For example, when the universal serial bus device 102 is plugged in the host 104, the host 104 generates a 'chirp' signal, and the chirp signal is a signal comprising over 250 cycles of data bits. Then, the chirp signal may be utilized by the universal serial bus device 102 to adjust the oscillating signal generated by the RC oscillator, and to therefore generate the first clock signal Sc1 accurately.

Compared to the conventional methods, the present invention generates the first clock signal Sc1 utilized for synchronizing the data signal SD and the second clock signal Sc2 corresponding to the transmitting mode by using only one RC oscillator. Therefore, the cost of the signal generating apparatus 100 is lower than the cost of a conventional signal generating apparatus. In addition, the area occupied by the resistor is far less than the area of the inductor. Furthermore, in an integrated circuit, since the electrical characteristic of the resistor is more stable than the inductor, the frequency generating circuit 1006 implemented by an RC oscillator generates the oscillating frequency more precisely.

Figure 6:
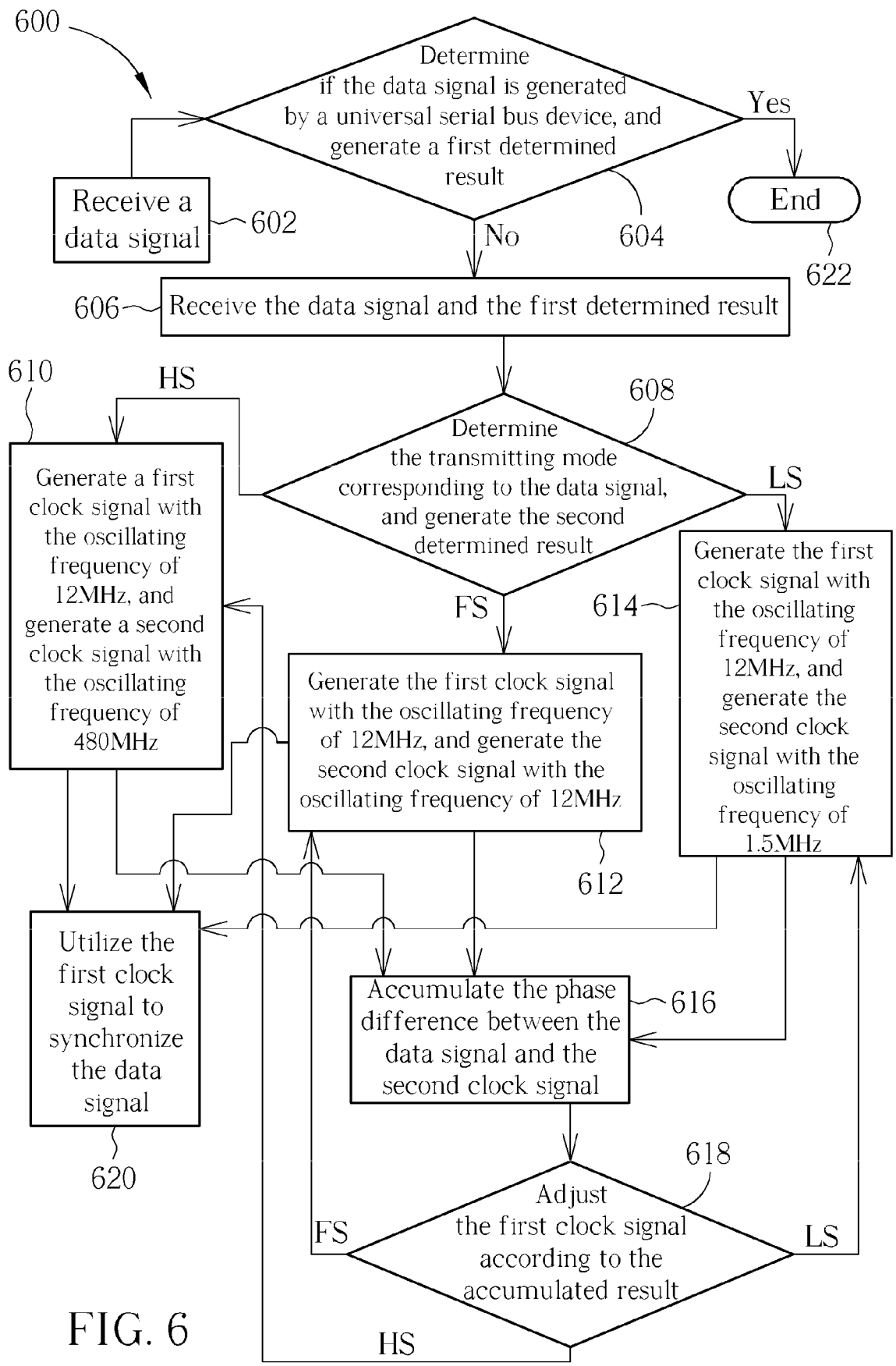
FIG. 6 is a flowchart illustrating a signal generating method according to an embodiment of the present invention.

Please refer to FIG. 6. FIG. 6 is a flowchart illustrating a signal generating method 600 according to an embodiment of the present invention. The signal generating method 600 is applicable in a universal serial bus device. In this embodiment, the signal generating method 600 is implemented by the signal generating apparatus 100 shown in FIG. 1 for brevity. Therefore, the following description related to the signal generating method 600 is illustrated in conjunction with the signal generating apparatus 100. In other words, the signal generating method 600 implemented by the signal generating apparatus 100 only serves as one example of the present invention. The signal generating method 600 of the present invention is not limited to the signal generating apparatus 100. Provided that substantially the same result is achieved, the steps of the flowchart shown in FIG. 6 need not be in the exact order shown and need not be contiguous, that is, other steps can be intermediate. The signal generating method 600 comprises the following steps:

Step 602: Receive the data signal SD;

Step 604: Determine if the data signal SD is generated by the universal serial bus device 102, and generate the first determined result Sa1; when the first determined result Sa1 indicates that the data signal SD is generated by the universal serial bus device 102, go to step 622, and when the first determined result Sa1 indicates that the data signal SD is not generated by the universal serial bus device 102, go to step 606;

Step 606: Receive the data signal SD and the first determined result Sa1;

Step 608: Determine the transmitting mode corresponding to the data signal SD, and generate the second determined result Sa2; when the second determined result Sa2 indicates the transmitting mode is a high speed data signal, go to step 610, when the second determined result Sa2 indicates the transmitting mode is a full speed data signal, go to step 612, and when the second determined result Sa2 indicates the transmitting mode is a low speed data signal, go to step 614;

Step 610: Generate the first clock signal Sc1 with the oscillating frequency of 12 MHz, and generate the second clock signal Sc2 with the oscillating frequency of 480 MHz, go to step 616 and step 620;

Step 612: Generate the first clock signal Sc1 with the oscillating frequency of 12 MHz, and generate the second clock signal Sc2 with the oscillating frequency of 12 MHz, go to step 616 and step 620;

Step 614: Generate the first clock signal Sc1 with the oscillating frequency of 12 MHz, and generate the second clock signal Sc2 with the oscillating frequency of 1.5 MHz, go to step 616 and step 620;

Step 616: Accumulate the phase difference between the data signal SD and the second clock signal Sc2 to generate the accumulated result;

Step 618: Adjust the first clock signal Sc1 according to the accumulated result; when the data signal SD is the high speed data signal, go to step 610, when the data signal SD is the full speed data signal, go to step 612, when the data signal SD is the low speed data signal, go to step 614;

Step 620: Utilize the first clock signal Sc1 to synchronize the data signal SD;

Step 622: End.

In step 604, when the data signal SD is not generated by the universal serial bus device 102, this indicates that the data signal SD is transmitted from the host 104. Thus, the signal generating apparatus 100 generates the first clock signal Sc1 with the oscillating frequency of 12 MHz to synchronize the data signal SD. On the other hand, when the data signal SD is generated by the universal serial bus 102, and the data signal SD is transmitted to the host 104, then the data signal SD need not be synchronized. Please note that, since the determination of whether the data signal SD is generated by the universal serial bus 102 has been disclosed in the above-mentioned embodiment (e.g., FIG. 2), the detailed description is omitted here for brevity.

In step 608, the transmitting rate of the high speed data signal is 480 Mb/s, the transmitting rate of the full speed data signal is 12 Mb/s, and the transmitting rate of the low speed data signal is 1.5 Mb/s. Therefore, the second clock signal Sc2 with the oscillating frequency of 480 MHz, 12 MHz, and 1.5 MHz is generated in steps 610, 612, and 614 respectively. Meanwhile, the first clock signal Sc1 with the oscillating frequency of 12 MHz is also generated in the steps 610, 612, 614 for synchronizing the received data signal SD. In this embodiment, the first clock signal Sc1 and the second clock signal Sc2 are generated by an RC oscillator embedded in the signal generating apparatus 100. In other words, the RC oscillator first generates an oscillating signal with a fixed frequency (e.g., 480 MHz), then an adjustable frequency divider may be utilized to frequency-divide the oscillating signal to generate the second clock signal Sc2 with an oscillating frequency of 480 MHz, 12 MHz, or 1.5 MHz. Furthermore, another frequency divider may be utilized to frequency-divide the oscillating signal to generate the first clock signal Sc1 with an oscillating frequency of 12 MHz.

To generate an accurate (e.g., +/−500 ppm) first clock signal Sc1 for synchronizing the data signal SD, the present invention generates an accumulated result after the phase difference between the data signal SD and the second clock signal Sc2 is accumulated for a predetermined time (e.g., a specific number of clock cycles of the oscillating signal), wherein the accumulated result is the accumulated phase difference in the specific number of clock cycles of the oscillating signal (step 616). Then, by adjusting the phase or the frequency of the oscillating signal according to the accumulated result, the first clock signal Sc1 and the second clock signal Sc2 are generated accurately (step 618). In other words, when the step 618 is accomplished, the next step is one of the steps 610, 612, or 614. In the steps 610, 612, and 614, the first clock signal Sc1 and the second clock signal Sc2 are generated accurately.

Briefly, the signal generating apparatus 100 and the signal generating method 600 of the present invention generate the first clock signal Sc1 utilized for synchronizing the data signal SD and the second clock signal Sc2 corresponding to the transmitting mode by using only one RC oscillator. Therefore, the cost of the signal generating apparatus 100 is lower than the cost of the conventional one. In addition, the area occupied by the resistor is far less than the area of the inductor. Furthermore, in an integrated circuit, since the electrical characteristic of the resistor is more stable than the inductor, the frequency generating circuit 1006 implemented by an RC oscillator generates the oscillating frequency more precisely.

Those skilled in the art will readily observe that numerous modifications and alterations of the device and method may be made while retaining the teachings of the invention.

What is claimed is:

1. A signal generating apparatus, applicable in a universal serial bus (USB) device, comprising:
    a first determining circuit, for receiving a data signal, and for detecting the data signal to determine if the data signal is generated by the universal serial bus device or a USB host and accordingly generating a first determined result;
    a second determining circuit, coupled to the first determining circuit, for receiving the data signal and the first determined result and generating a second determined result by determining a transmitting mode of the data signal according to the first determined result and the data signal; and
    a frequency generating circuit, coupled to the second determining circuit, for generating a first clock signal utilized for synchronizing the data signal according to the second determined result;
wherein the first determining circuit is arranged to detect if a time interval of a specific voltage level of the data signal is shorter than a specific time value to distinguish if the data signal is generated by the universal serial bus device or the USB host, and the first determining circuit comprises:
    a voltage level detector, for detecting the specific voltage level of the data signal, wherein when the voltage level detector detects that the data signal reaches the specific voltage level, the voltage level detector generates a starting signal, and when the voltage level detector detects that the data signal deviates from the specific voltage level, the voltage level detector generates a finishing signal;

a time counter, coupled to the voltage level detector, for counting the time interval between the starting signal and the finishing signal;

a comparator, coupled to the time counter, for comparing the time interval and the specific time value to generate a comparison result; and a deciding circuit, coupled to the comparator, for determining if the data signal is generated by the universal serial bus device according to the comparison result;

wherein when the comparison result indicates that the time interval is shorter than the specific time value, the deciding circuit determines that the data signal is not generated by the universal serial bus device, and when the comparison result indicates that the time interval is not shorter than the specific time value, the deciding circuit determines that the data signal is generated by the universal serial bus device.

2. The signal generating apparatus of claim 1, wherein the frequency generating circuit generates a second clock signal corresponding to the transmitting mode according to the second determined result, and generates the first clock signal according to the second clock signal.

3. The signal generating apparatus of claim 2, further comprising:

a phase accumulating device, coupled to the first determining circuit, the second determining circuit, and the frequency generating circuit, for accumulating a phase difference between the data signal and the second clock signal to generate an accumulated result;

wherein the frequency generating circuit further adjusts the second clock signal according to the accumulated result.

4. The signal generating apparatus of claim 3, wherein the frequency generating circuit further adjusts a phase or a frequency of the second clock signal according to the accumulated result.

5. The signal generating apparatus of claim 1, wherein an oscillating frequency of the first clock signal is substantially equal to 12 MHz.

6. The signal generating apparatus of claim 1, wherein the data signal is a chirp signal.

7. The signal generating apparatus of claim 1, the transmitting mode is one of a first transmitting mode having data rate of 480 Mb/s, a second transmitting mode having data rate of 12 Mb/s, and a third transmitting mode having data rate of 1.5 Mb/s.

8. The signal generating apparatus of claim 1, wherein the second determining circuit comprises:

a filter, for performing a filtering process upon the data signal; and a deciding circuit, coupled to the filter, for determining the transmitting mode of the data signal according to a transmitting frequency of the data signal.

9. The signal generating apparatus of claim 1, wherein the second determining circuit comprises:

a counter, for counting a data transmitting amount of the data signal in a specific time; and a deciding circuit, coupled to the counter, for determining the transmitting mode of the data signal according to the data transmitting amount of the data signal.

10. A signal generating method, applicable in a universal serial bus (USB) device, comprising:

(a) receiving a data signal, and checking the data signal to determine if the data signal is generated by the universal serial bus device or a USB host and accordingly generating a first determined result;

(b) receiving the data signal and the first determined result and generating a second determined result by determining a transmitting mode of the data signal according to the first determined result and the data signal; and (c) generating a first clock signal utilized for synchronizing the data signal according to the second determined result;

wherein, in the step (a), the signal generating method detects if a time interval of a specific voltage level of the data signal is shorter than a specific time value to distinguish if the data signal is generated by the universal serial bus device or the USB host, and the step of determining if the data signal is generated by the universal serial bus device comprises:

detecting the specific voltage level of the data signal, wherein when it is detected that the data signal reaches the specific voltage level, generating a starting signal, and when it is detected that the data signal deviates from the specific voltage level, generating a finishing signal;

counting the time interval between the starting signal and the finishing signal;

comparing the time interval and the specific time value to generate a comparison result; and determining if the data signal is generated by the universal serial bus device according to the comparison result;

wherein when the comparison result indicates that the time interval is shorter than the specific time value, determining that the data signal is not generated by the universal serial bus device, and when the comparison result indicates that the time interval is not shorter than the specific time value, determining that the data signal is generated by the universal serial bus device.

11. The signal generating method of claim 10, wherein the step of generating the first clock signal comprises:

generating a second clock signal corresponding to the transmitting mode according to the second determined result, and generating the first clock signal according to the second clock signal.

12. The signal generating method of claim 10, wherein the data signal is a chirp signal.

13. The signal generating method of claim 10, wherein the transmitting mode is one of a first transmitting mode having data rate of 480 Mb/s, a second transmitting mode having data rate of 12 Mb/s, and a third transmitting mode having data rate of 1.5 Mb/s.

14. The signal generating method of claim 10, wherein an oscillating frequency of the first clock signal is substantially equal to 12 MHz.

15. The signal generating method of claim 10, further comprising:

accumulating a phase difference between the data signal and the first clock signal to generate an accumulated result;

wherein the step of generating the first clock signal comprises:

adjusting the first clock signal according to the accumulated result.

16. The signal generating method of claim 10, wherein the step of determining the transmitting mode corresponding to the data signal comprises:

performing a filtering process upon the data signal to extract a transmitting rate of then data signal; and determining the transmitting mode of the data signal according to the transmitting rate of the data signal.

17. The signal generating method of claim 10, wherein the step of determining the transmitting mode corresponding to the data signal comprises:
 counting a data transmitting amount of the data signal in a specific time; and
 determining the transmitting mode of the data signal according to the data transmitting amount of the data signal.

\* \* \* \* \*